(12) United States Patent
Busche et al.

(10) Patent No.: US 10,121,688 B2
(45) Date of Patent: Nov. 6, 2018

(54) ELECTROSTATIC CHUCK WITH EXTERNAL FLOW ADJUSTMENTS FOR IMPROVED TEMPERATURE DISTRIBUTION

(71) Applicant: APPLIED MATERIALS, INC., Santa Clara, CA (US)

(72) Inventors: Matthew J. Busche, Santa Clara, CA (US); Vijay D. Parkhe, San Jose, CA (US); Wendell Boyd, Jr., Morgan Hill, CA (US); Senh Thach, Union City, CA (US); Konstantin Makhratchev, Freemont, CA (US); Masanori Ono, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/481,183

(22) Filed: Apr. 6, 2017

(65) Prior Publication Data

US 2017/0213754 A1    Jul. 27, 2017

Related U.S. Application Data

(62) Division of application No. 14/145,680, filed on Dec. 31, 2013, now Pat. No. 9,622,375.

(51) Int. Cl.
*H01L 21/683* (2006.01)
*H05K 7/20* (2006.01)
*H01L 21/67* (2006.01)

(52) U.S. Cl.
CPC .... *H01L 21/6833* (2013.01); *H01L 21/67103* (2013.01); *H01L 21/67109* (2013.01); *H01L 21/6831* (2013.01); *H05K 7/20218* (2013.01); *H05K 999/99* (2013.01)

(58) Field of Classification Search
CPC .......... H01L 21/6833; H01L 21/67103; H01L 21/67109; H01L 21/6831; H05K 7/20218
See application file for complete search history.

(56) References Cited

U.S. PATENT DOCUMENTS

| | | |
|---|---|---|
| 5,656,093 A | 8/1997 | Burkhart |
| 5,835,334 A | 11/1998 | McMillin et al. |
| 6,179,921 B1 | 1/2001 | Ruffell |
| 6,375,086 B1 | 4/2002 | Babin et al. |

(Continued)

OTHER PUBLICATIONS

PCT/US2014/072240, Notification of Transmittal of the International Search Report and the Written Opinion of the International Searching Authority, dated Apr. 16, 2015, 15 pages.

*Primary Examiner* — Zeev V Kitov
(74) *Attorney, Agent, or Firm* — Schwabe, Williamson & Wyatt, P.C.

(57) ABSTRACT

An electrostatic chuck is described with external flow adjustments for improved temperature distribution. In one example, a method for adjusting coolant flow in an electrostatic chuck includes heating a dielectric puck, the dielectric puck being for electrostatically gripping a silicon wafer. Heat is detected at a plurality of locations on a top surface of the dielectric puck, the locations each being thermally coupled to at least one of a plurality of coolant chambers of the electrostatic chuck. A plurality of valves are adjusted to control coolant flow into the coolant chambers based on the detected heat.

20 Claims, 14 Drawing Sheets

(56) References Cited

U.S. PATENT DOCUMENTS

| | | |
|---|---|---|
| 6,490,146 B2 | 12/2002 | Wang et al. |
| 6,538,872 B1 | 3/2003 | Wang et al. |
| 6,740,853 B1 * | 5/2004 | Johnson ............... C23C 16/4586 118/620 |
| 7,697,260 B2 * | 4/2010 | Brown ................. H01L 21/6831 279/128 |
| 8,226,769 B2 | 7/2012 | Matyushkin et al. |
| 8,461,674 B2 | 6/2013 | Gaff et al. |
| 8,546,732 B2 | 10/2013 | Singh |
| 8,587,113 B2 | 11/2013 | Gaff et al. |
| 8,624,168 B2 | 1/2014 | Gaff et al. |
| 8,637,794 B2 | 1/2014 | Singh et al. |
| 8,663,391 B2 | 3/2014 | Matyushkin et al. |
| 8,884,194 B2 | 11/2014 | Singh et al. |
| 8,937,800 B2 | 1/2015 | Lubomirsky et al. |
| 9,196,514 B2 | 11/2015 | Parkhe et al. |
| 9,866,151 B2 * | 1/2018 | Tatsumi ................. H02N 13/00 |
| 2002/0179165 A1 * | 12/2002 | Hu ........................... F01P 7/167 137/875 |
| 2005/0133157 A1 * | 6/2005 | Choi ................. H01L 21/67109 156/345.27 |
| 2008/0017104 A1 | 1/2008 | Matyushkin et al. |
| 2008/0083736 A1 * | 4/2008 | Steger ............... H01L 21/67248 219/494 |
| 2009/0114158 A1 | 5/2009 | Zucker et al. |
| 2010/0116788 A1 | 5/2010 | Singh et al. |
| 2013/0120897 A1 | 5/2013 | Lin |
| 2013/0161305 A1 | 6/2013 | Ptasienski et al. |
| 2013/0220989 A1 | 8/2013 | Pease et al. |
| 2014/0045337 A1 | 2/2014 | Singh et al. |
| 2014/0047705 A1 | 2/2014 | Singh et al. |
| 2014/0048529 A1 | 2/2014 | Pease |
| 2014/0096909 A1 | 4/2014 | Singh et al. |
| 2014/0154819 A1 | 6/2014 | Gaff et al. |
| 2014/0238637 A1 * | 8/2014 | Tanaka .................... F25B 21/02 165/47 |
| 2015/0129165 A1 | 5/2015 | Parkhe et al. |
| 2015/0155193 A1 | 6/2015 | Hsu et al. |
| 2015/0170977 A1 | 6/2015 | Singh |
| 2015/0187625 A1 | 7/2015 | Busche et al. |
| 2015/0187626 A1 | 7/2015 | Parkhe et al. |
| 2015/0228513 A1 | 8/2015 | Parkhe et al. |
| 2015/0311105 A1 | 10/2015 | Sadjadi et al. |
| 2015/0364354 A1 | 12/2015 | Tantiwong et al. |
| 2015/0366004 A1 | 12/2015 | Nangoy et al. |
| 2016/0027678 A1 | 1/2016 | Parkhe et al. |

* cited by examiner

ELECTROSTATIC CHUCK WITH EXTERNAL FLOW ADJUSTMENTS FOR IMPROVED TEMPERATURE DISTRIBUTION

CROSS-REFERENCE TO RELATED APPLICATIONS

The present application is a division of prior U.S. patent application Ser. No. 14/145,680, filed Dec. 31, 2013, entitled ELECTROSTATIC CHUCK WITH EXTERNAL FLOW ADJUSTMENTS FOR IMPROVED TEMPERATURE DISTRIBUTION, by Matthew J. Busche, et al., the priority of which is hereby claimed and the contents of which are hereby incorporated by reference herein.

TECHNICAL FIELD

Embodiments of the present invention relate to the microelectronics manufacturing industry and more particularly to temperature controlled chucks for supporting a workpiece during plasma processing.

BACKGROUND

In the manufacture of semiconductor chips a silicon wafer or other substrate is exposed to a variety of different processes in different processing chambers. The chambers may expose the wafer to plasmas, chemical vapors, metals, laser etching, and various deposition and acid etching processes in order to form circuitry and other structures on the wafer. During these processes, the silicon wafer may be held in place by an electrostatic chuck (ESC). The chuck holds the wafer by generating an electrostatic field to clamp the back side of the wafer to a flat surface or puck surface of the chuck.

As fabrication techniques for plasma processing equipment advance, such as those designed to perform plasma etching of microelectronic devices and the like, the temperature of the wafer during processing becomes more important.

ESCs have been designed for thermal uniformity across the surface of the substrate, sometimes called a workpiece. ESCs use liquid cooling to absorb the plasma power heat and remove it from the chuck. An ESC may also include independently controlled heaters in multiple zones. This allows for a wider process window under different process and plasma conditions. Individual heater zones in the radial direction can create various radial temperature profiles which compensate for other etch process radial non-uniformities. However, radial heaters cannot affect non-uniformities in the azimuthal direction.

In semi-conductor etch processing, the temperature of a wafer during processing influences the rate at which structures on the wafer are etched. Other processes may also have a temperature dependence. This temperature influence is present, for example, in conductor etch applications in which very precise wafer temperature control helps to obtain a uniform etch rate. A more precise thermal performance allows for more precisely formed structures on the wafer. Uniform etch rates across the wafer allow smaller structures to be formed on the wafer. Thermal performance or temperature control is therefore a factor in reducing the size of transistors and other structures on a silicon chip.

SUMMARY

An electrostatic chuck is described with external flow adjustments for improved temperature distribution. In one example, a method for adjusting coolant flow in an electrostatic chuck includes heating a dielectric puck, the dielectric puck being for electrostatically gripping a silicon wafer. Heat is detected at a plurality of locations on a top surface of the dielectric puck, the locations each being thermally coupled to at least one of a plurality of coolant chambers of the electrostatic chuck. A plurality of valves are adjusted to control coolant flow into the coolant chambers based on the detected heat.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
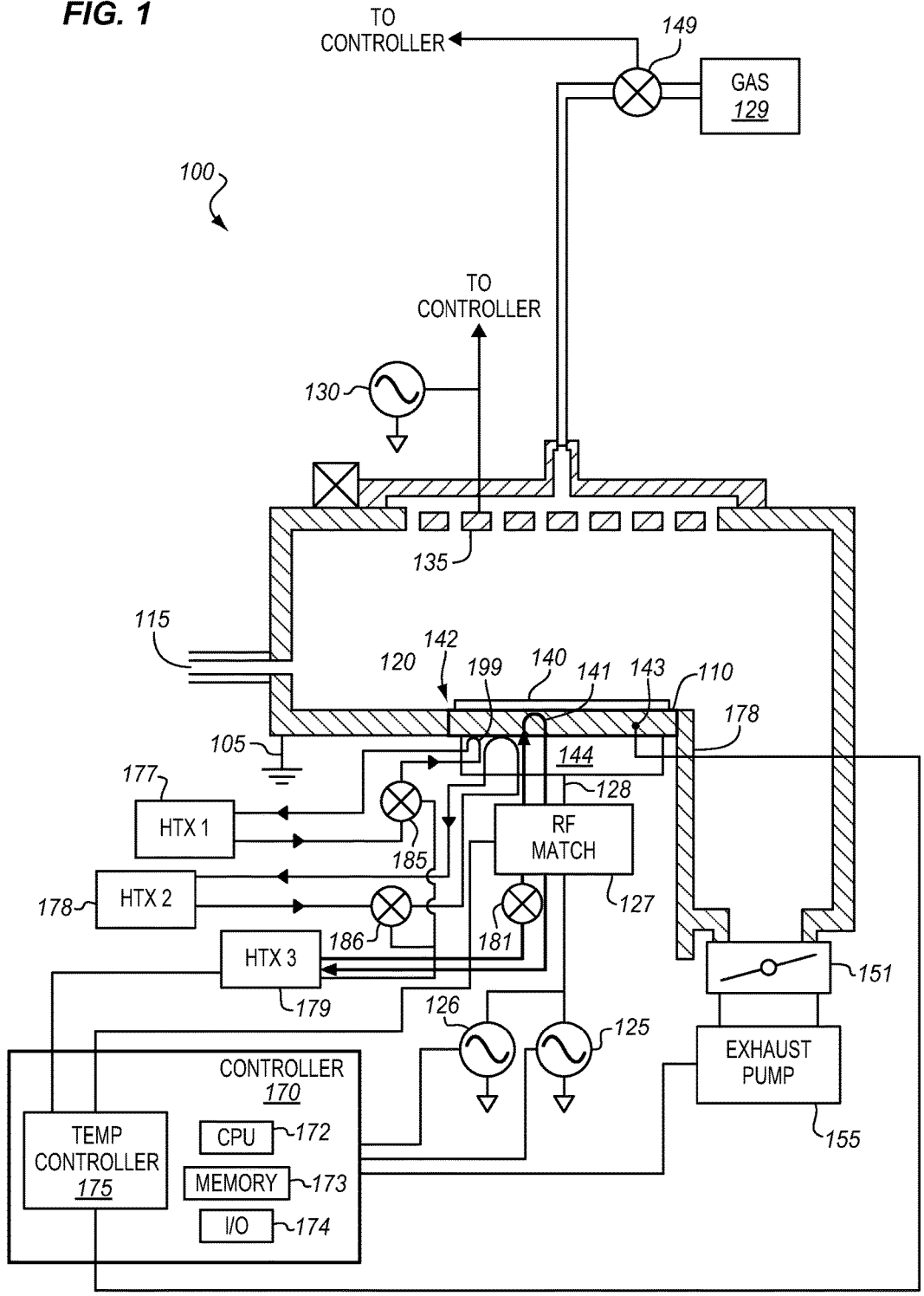
FIG. 1 is a schematic of a plasma etch system including a chuck assembly in accordance with an embodiment of the present invention.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

The temperature uniformity across the surface of an ESC has been improved with improved cooling plate and heater designs and improvements in bonding the cooling plate to the puck that holds the workpiece. However, these designs and processes are still subject to manufacturing variations, which can lead to significant thermal non-uniformity. For some implementations, a spatial temperature variation of less than +/−0.3° C. across the wafer is desired.

The temperature of the ESC can be more precisely controlled by using a plurality of small heaters, but this requires complex wiring and control systems, at significant cost. In embodiments described herein, a plasma processing chuck includes a plurality of independently adjustable valves. The valves control the flow of coolant to different areas of the cooling base. The thermal performance of the chuck can be improved through the adjustment of many small valves in the cooling plate. The local values of R, the thermal resistance of the cooling plate, can also be changed for the cooling plate. This possibility has not existed in previous ESC designs. As described herein, this new cooling plate is simple and can be calibrated, manufactured and used at low cost. The valves can be used to correct manufacturing variations, to compensate for chamber and process inconsistencies, and to vary the temperature for different areas of the workpiece.

FIG. 1 is a schematic of a plasma etch system 100 including a chuck assembly 142 in accordance with an embodiment of the present invention. The plasma etch system 100 may be any type of high performance etch chamber known in the art, such as, but not limited to, Enabler™, DPS II, AdvantEdge™ G3, E-MAX®, Axiom, Orion, or Mesa CIP chambers, all of which are manufactured by Applied Materials of California, USA. Other commercially available etch chambers may similarly utilize the chuck assemblies described herein. While the exemplary embodiments are described in the context of the plasma etch system 100, the chuck assembly described herein is also adaptable to other processing systems used to perform any plasma fabrication process (e.g., plasma deposition systems, etc.)

Referring to FIG. 1, the plasma etch system 100 includes a grounded chamber 105. Process gases are supplied from gas source(s) 129 connected to the chamber through a mass flow controller 149 to the interior of the chamber 105. Chamber 105 is evacuated via an exhaust valve 151 connected to a high capacity vacuum pump stack 155. When plasma power is applied to the chamber 105, a plasma is formed in a processing region over a workpiece 110. A plasma bias power 125 is coupled into a chuck assembly 142 to energize the plasma. The plasma bias power 125 typically has a low frequency between about 2 MHz to 60 MHz, and may be, for example, in the 13.56 MHz band. In an example embodiment, the plasma etch system 100 includes a second plasma bias power 126 operating at about the 2 MHz band which is connected to an RF match 127. The plasma bias power 125 is also coupled to the RF match and also coupled to a lower electrode 120 via a power conduit 128. A plasma source power 130 is coupled through another match (not shown) to a plasma generating element 135 to provide high frequency source power to inductively or capacitively energize the plasma. The plasma source power 130 may have a higher frequency than the plasma bias power 125, such as between 100 and 180 MHz, and may, for example, be in the 162 MHz band.

A workpiece 110 is loaded through an opening 115 and clamped to a chuck assembly 142 inside the chamber. The workpiece 110, such as a semiconductor wafer, may be any wafer, substrate, or other material employed in the semiconductor processing art and the present invention is not limited in this respect. The workpiece 110 is disposed on a top surface of a dielectric layer 143 or puck of the chuck assembly that is disposed over a cooling base assembly 144 of the chuck assembly. A clamp electrode (not shown) is embedded in the dielectric layer 143. In particular embodiments, the chuck assembly 142 may include different heater zones, such as a center zone 141 and edge zones 199, each zone 141, 199 may be independently controllable to the same or to different temperature set points.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The system controller 170 also includes a central processing unit 172, memory 173 and input/output interface 174. The temperature controller 175 is to output control signals affecting the rate of heat transfer between the chuck assembly 142 and a heat source and/or heat sink external to the plasma chamber 105 for the various heater zones 141, 199.

In embodiments, in addition to the different heaters, there may be different coolant temperature zones. The coolant zones may include separate, independently controlled heat transfer fluid loops with separate flow control that is controlled based on a zone-specific temperature feedback loop. In the example embodiment, the temperature controller 175 is coupled to a first heat exchanger (HTX)/chiller 177 and may further be coupled to a second HTX/chiller 178 and a third HTX/chiller 179. The flow rate of the heat transfer fluid or coolant through conduits in the chuck assembly 142 may also be controlled by the heat exchangers.

One or more valves 185, 186 (or other flow control devices) between the heat exchanger/chillers 177, 178, 179 and fluid conduits in the chuck assembly 142 may be controlled by the temperature controller 175 to independently control a rate of flow of the heat transfer fluid to each of the different cooling zones. The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluids such as those containing perfluorinated inert polyethers. While the present description describes the ESC in the context of a plasma processing chamber, the ESC described herein may be used in a variety of different chambers and for a variety of different processes.

Figure 2:
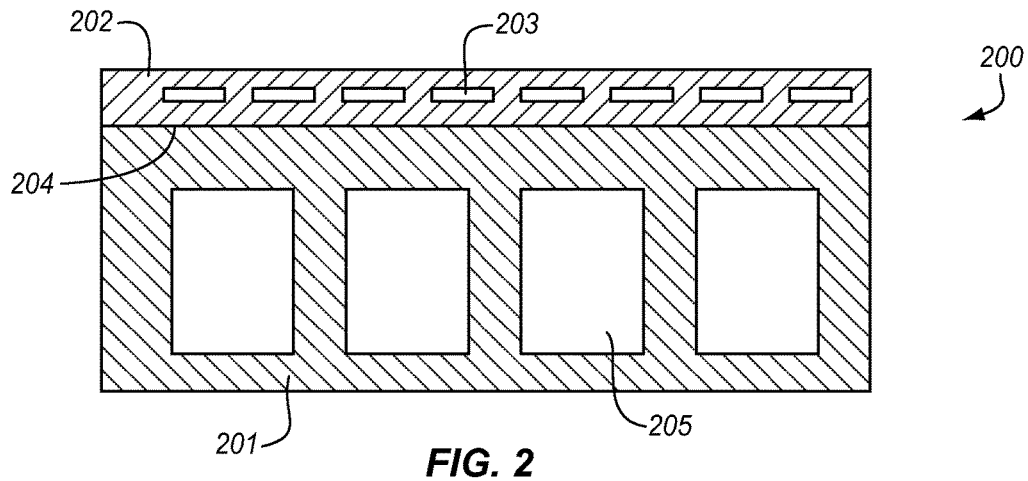
FIG. 2 is a simplified cross-sectional diagram of a portion of an electrostatic chuck in accordance with an embodiment of the invention.

FIG. 2 is a simplified cross-sectional diagram of a portion of an electrostatic chuck (ESC) 200. There are at least four components for regulating the temperature of the chuck surface and therefore the temperature of a wafer (not shown) on the chuck. A cooling plate 201, typically made from a thermally conducting metal serves as a heat sink. The cooling plate is bonded to a dielectric puck 202 with a high temperature adhesive 204, such as silicone. The puck is typically ceramic but may alternatively be made with other materials. Electrodes (not shown) are embedded within the puck to generate an electrostatic field with which to grip a workpiece, such as a silicon substrate. Resistive heater traces 203 are also embedded within the puck for temperature control.

The cooling plate 201 also includes channels 205 for coolant. Coolant is pumped through the channels to absorb heat from the cooling plate and pumped to a heat exchanger to cool the fluid which is then recirculated back to the cooling plate. The cooling plate absorbs heat from the embedded heaters and the workpiece through the ceramic plate. The temperature uniformity depends on the quality of the ceramic puck 202, the elastomer bond 204, and the cooling plate channels 205. It also depends on how well heat is transferred from the workpiece to the ceramic puck. All of these factors are subject to variations in manufacture and use.

Figure 3:
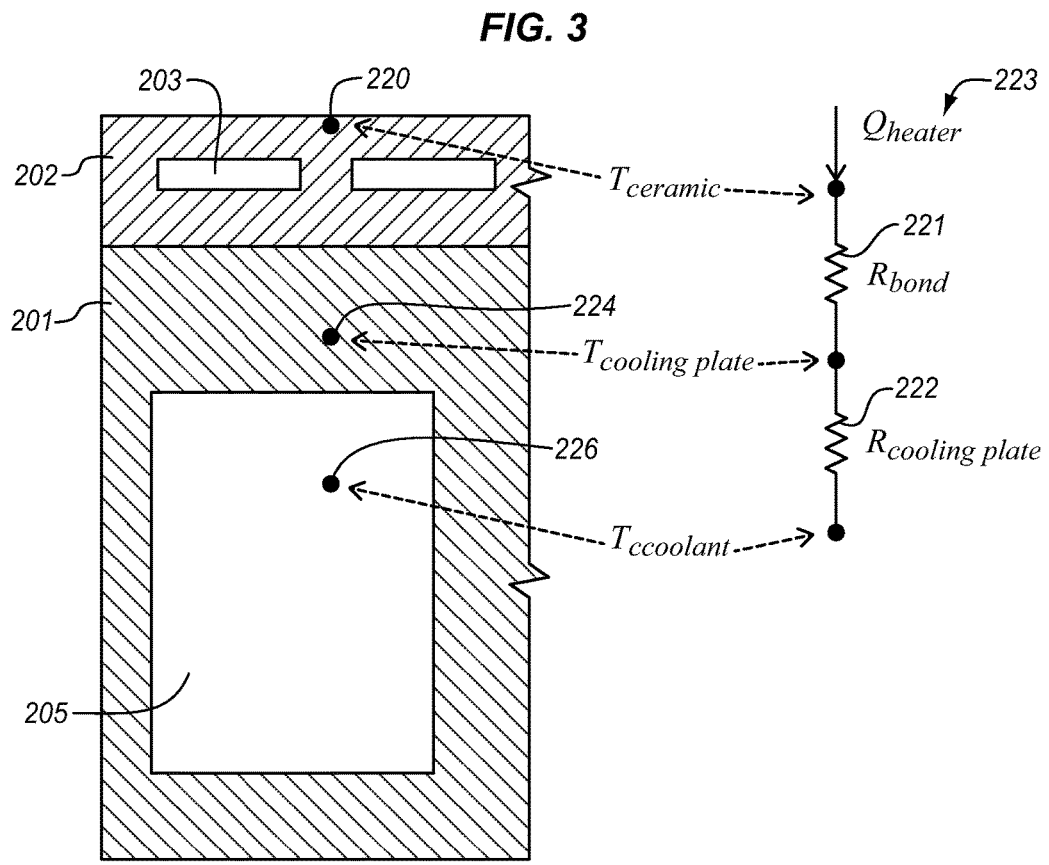
FIG. 3 is a simplified cross-sectional diagram of a model of ESC temperature and thermal conduction for an electrostatic chuck in accordance with an embodiment of the invention.

FIG. 3 is a simplified one-dimensional diagram of a model of ESC temperature and thermal conduction. The diagram is presented using the same components and reference numbers as in FIG. 2, however, only a portion of the FIG. 2 diagram is shown for reference. In this model, the ceramic temperature, Tceramic, at a given location 220 is determined in part by the "thermal resistances" of the cooling plate (R cooling plate) 222 and the bond (R bond) 221. Heat is provided by the heater power (Q heater) 223 and removed by the cooling plate (T cooling plate 224) and by the coolant (T coolant 226). The thermal resistance is presented for purposes of explanation. The components of FIG. 3 may be described as follows:

Q heater 223: The heater power at a given point on the ESC surface is determined by the number of heater traces in the area, and the electrical resistance of those heater traces. When the chuck is in use, heat is also applied by the plasma. For testing purposes, the heaters may be used to simulate plasma processing or any other high temperature processing or a different external or internal heat source may be used. If the heater traces produce sufficient heating, then the heater traces may be used. Rather than generating temperatures similar to those used for plasma processing, the heater traces may be used simply to generate a measureable heat flow from the ceramic puck 202 to the other components.

R bond 221: The resistance of the bond is determined by the thermal conductivity of the bond material, the bond thickness, and the quality of the bond connection both to the cooling plate and to the ceramic puck.

T cooling plate 224: The temperature of the cooling plate is largely controlled by the conduction of heat from the ceramic puck through the bond and into the coolant. The flow of heat into the coolant at any one location 224 of the cooling plate is affected by at least two factors: 1) the coolant temperature increases as it travels through the cooling plate so that the coolant at different locations of the cooling plate will be at different temperatures and 2) feedthrus and other features of the cooling plate constrain where the cooling channels can be placed in the cooling plate so that some locations have more coolant flow then others.

R cooling plate 222: The thermal resistance of the cooling plate is a combined function of the local fluid heat transfer coefficient, the geometry of the cooling plate, and the thermal conductivity of the cooling plate.

T coolant 226: The temperature of the coolant entering the cooling plate may be carefully controlled by a heat exchanger or chiller. However, as the coolant travels through the cooling plate, its temperature increases. In a typical application, the coolant temperature may rise by up to 10° C. So the local coolant temperature at a given point on the ESC varies greatly.

T ceramic: The temperature of the ESC ceramic at any one particular location 220 may be estimated using the relationship:

T ceramic=Q heater R bond+Q heater R cooling plate+T coolant.

This shows that to achieve a uniform temperature across the ceramic puck, R cooling plate may be adjusted at each location to compensate for variation of R bond, Q heater, and T coolant. Alternatively, another way to achieve the most uniform ceramic temperature possible is to design the heater traces (and hence Q heater) to compensate for the spatial variations of the cooling plate temperature. In other words Q heater is adjusted based on variations in R cooling plate and T coolant.

In an ideal ESC design, the heater watt density will be matched to perfectly compensate for variations in the cooling plate temperature. The bond thickness is uniform. As a result, the ceramic temperature is uniform in every dimension. In any real manufactured ESC, the ceramic temperature is non-uniform due to several factors. First, the design of the heater traces may not be perfect. As a result an ideally uniform watt density is difficult to achieve. Second, the heater traces are manufactured or created using a screen printing process. Printing error causes the actual watt density to deviate still further from the imperfect values that were designed for the traces. Third, the bond thickness of the adhesive varies. As a result, a typical manufactured ESC does not have perfectly uniform bond heat resistance.

Figure 4:
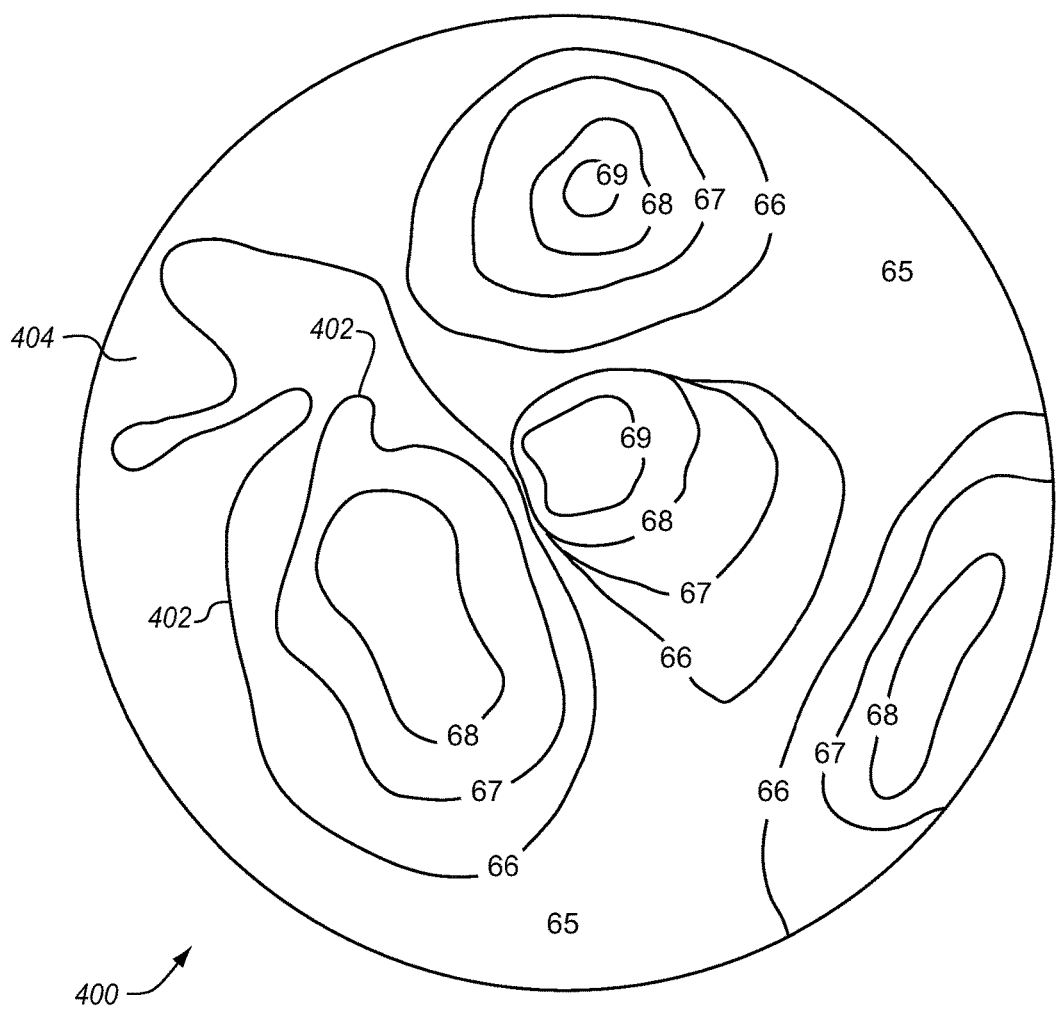
FIG. 4 is a diagram of a top elevation contour line graph of the temperature of a wafer in a processing chamber.

FIG. 4 is a diagram of a top elevation graph 400 of the temperature of a wafer 404 on an ESC. This graph shows surface temperature as a function of position on the wafer using contour lines 402. Such a diagram may be generated based on a measurement of an actual ESC as it is heated by the conductive traces and cooled by coolant flowing through the channels of the cooling base. Such measurements may be made by heating a wafer and then measuring the temperature at different positions using an infrared camera. As shown, the temperature values shown on the surface temperature contour lines vary in a pattern that is related to manufacturing and design features of the ESC. Contour lines are shown only for integer temperature values in order to simplify the diagram. For an actual measurement, much higher accuracy, for example tenths of a degree may be desired.

In order to even out the temperatures and obtain a more uniform temperature across the ESC, external adjustments can be made to the coolant flow within the ESC. In one example, the cooling plate contains many (e.g. 50+) small flow control valves. These valves may be made accessible from outside the cooling plate to allow them to be adjusted. Adjustments to the coolant flow through the valves may be based on a one-time calibration using an infra-red camera or based on a continuing calibration process. The calibration can compensate for manufacturing defects in the ESC and drastically improve the thermal performance characteristics of the cooling plate. The small control valves may be adjusted using small gear motors. The calibration process may use the motors to adjust each valve based on real-time feedback from an infra-red camera.

Figure 5:
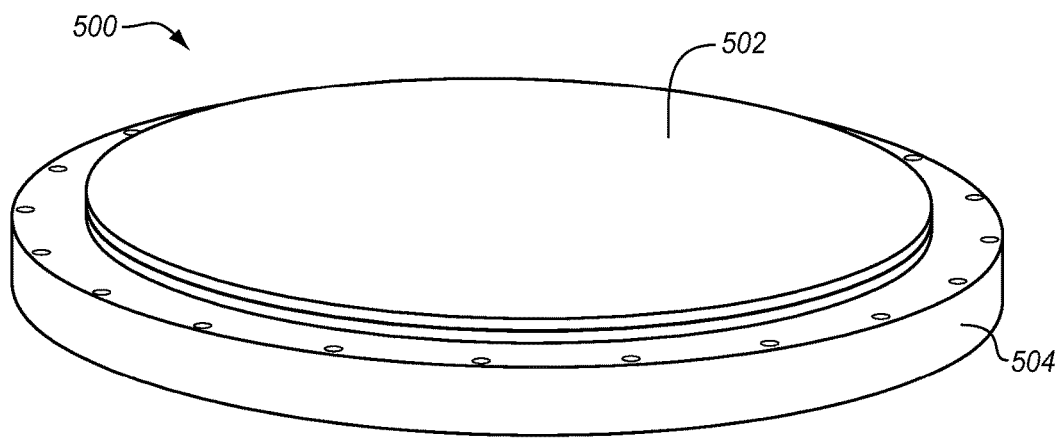
FIG. 5 is an isometric view of an electrostatic chuck in accordance with an embodiment of the invention.

FIG. 5 is an isometric view of an ESC 500 showing a ceramic puck 502 over a cooling plate 504. The diagram is simplified and does not include electrical, coolant and control connections. The diagram also does not show a variety of different "feedthru" holes in the ceramic puck. These holes are required to accommodate gas outlets, temperature probes, and wafer lift pins.

Figure 6:
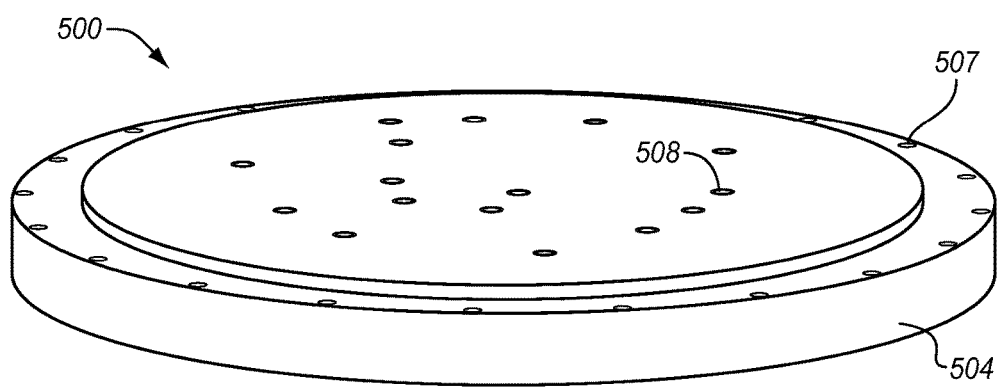
FIG. 6 is an isometric view of the electrostatic chuck of FIG. 5 with the puck removed in accordance with an embodiment of the invention.

FIG. 6 is an isometric view of the ESC of FIG. 5 with the ceramic puck removed so that only the cooling plate 504 is visible. The ceramic puck may be attached to the cooling plate in any of a variety of different ways. Typically, the ceramic puck is attached with a bond, such as metallic, nano-foil or silicone adhesive filled with a thermally conductive material, such as alumina, although the invention is not so limited. The cooling plate includes feedthru holes 508 as mentioned above. The periphery of the cooling plate includes mounting holes 507 to attach the ESC to a mounting carriage as shown in FIG. 1.

Figure 7:
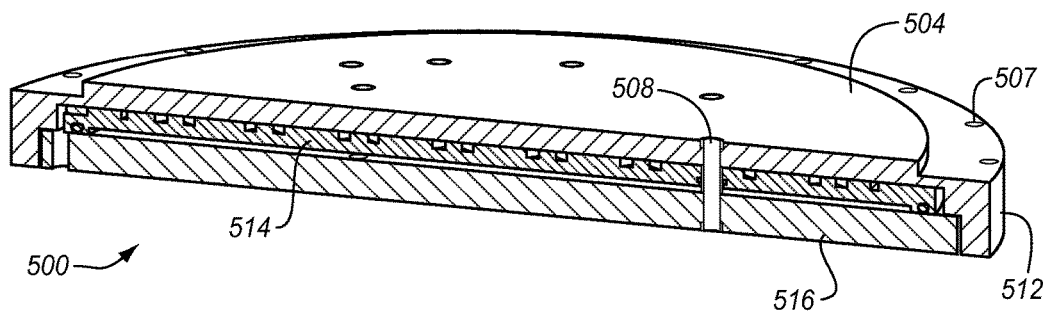
FIG. 7 is an isometric view of an electrostatic chuck cut in half accordance with an embodiment of the invention.

FIG. 7 is an isometric view of the same ESC 500 cut vertically in half to show a cross section of the internal configuration. The cooling plate 504, in this example is formed of three parts, a top plate 512 to which the ceramic puck is attached, a middle plate 514, and a bottom plate 516. In the illustrated example, the top plate is also attached to the carrier structure through peripheral bolt holes 507 and the top plate surrounds and protects the middle and bottom plates, however, the invention is not so limited. The top plate may be constructed of a durable material able to survive a processing chamber environment, such as ceramic or metal. The bottom plate is subject to less exposure to the chamber and so may be constructed of the same or a less durable material. The middle plate is protected by the top and bottom plates and may be constructed of a different material, such as a plastic.

One of the feedthru holes 508 is visible in this cross-section. It extends through top, middle, and bottom plates so that electrical connectors, gases, or any other desired materials may be connected through the cooling plate. Additional feedthrus (not shown) may extend only partially through the cooling plate for other purposes.

Figure 8:
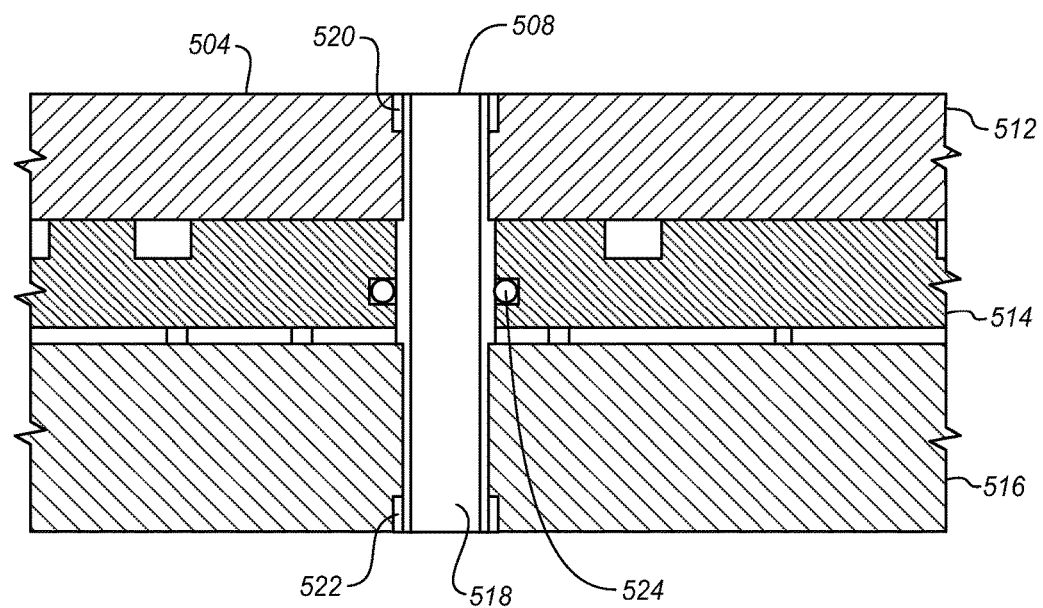
FIG. 8 is a cross-sectional view of a feedthru channel of an electrostatic chuck in accordance with an embodiment of the invention.

FIG. 8 shows a feedthru in more detail. The feedthru may be provided by a sleeve 518 attached to the top 512 and bottom 516 plates by an adhesive or by welding 520, 522. In the illustrated example, the sleeve is sealed against the middle plate using O-rings 524. This allows a seal to be made against a plastic material for which welding is not possible. The connections may be made in any of a variety of other ways depending on the materials used for the sleeve and the plates, including by brazing or using adhesives, or epoxy, among others. The sleeve protects the electrical or other components (not shown) inside the sleeve. The sleeve also provides additional rigidity to the cooling plate.

Figure 9:
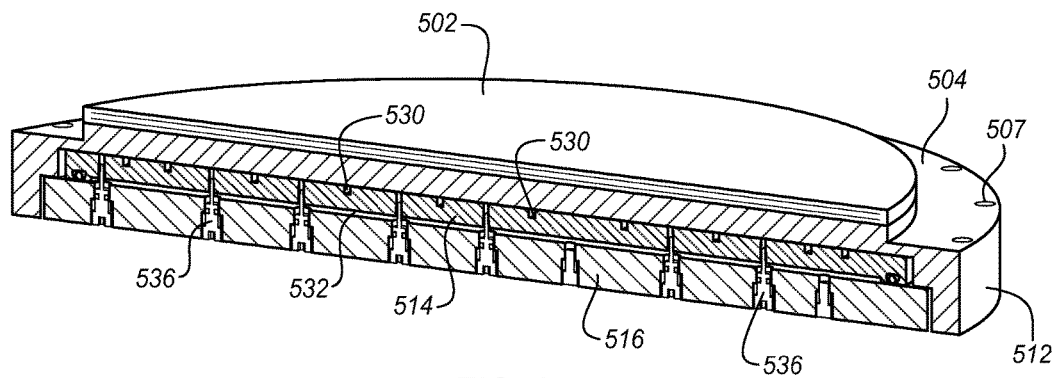
FIG. 9 is a cross-sectional cutaway view of a ceramic puck and a cooling plate in accordance with an embodiment of the invention.

FIG. 9 is a cross-sectional cutaway view of the ceramic puck 502 bonded to the cooling plate 504. Electrical connectors and feedthrus are not shown, however, the upper portion 512, middle portion 514 and lower portion 516 are shown. Cooling chambers 530 are defined as spaces between the middle 514 and upper 512 portions. A supply plenum 532 is defined between the middle 514 and bottom 516 portions. The feedthrus (not shown) pass through the cooling chambers and can interfere with the flow of coolant and the design of the coolant chambers.

In this example, a large number of flow control valves 536 are embedded in the bottom cooling plate. The valves are in channels between the supply plenum and each coolant chamber. Each valve controls the flow of coolant from the supply plenum to its associated coolant chamber. The channels are from the bottom of the middle plate where there is an inlet, through the middle plate to the top of the middle plate where there is an outlet. Features in the mid plate act as valve seats for each valve. The valve plug or valve body is threaded against the bottom plate and can be moved up and down through rotation. By moving the valve plug manually or automatically, the flow through each individual cooling zone can be adjusted. The automatic operation can adjust flow for different plasma conditions or non-uniformities.

Figure 10:
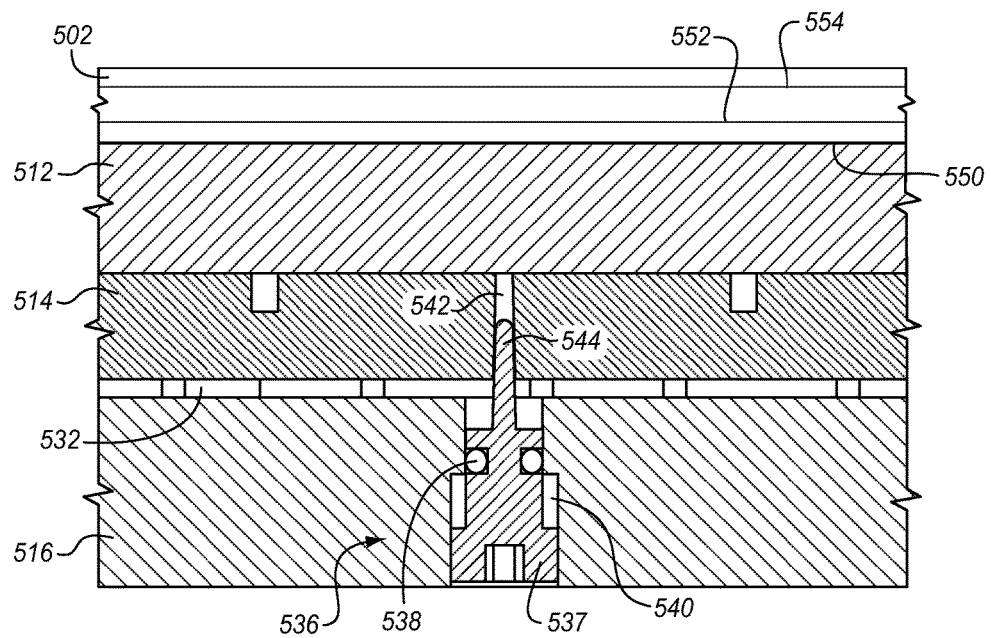
FIG. 10 is a cross-sectional cutaway view of a valve of an electrostatic chuck in accordance with an embodiment of the invention.

FIG. 10 shows a single valve in more detail in a cross-sectional diagram view of a portion of the ESC. The valve 536 includes a valve body 537 which is threaded against threads 540 of the lower plate 516. In this type of valve, rotation drives a plunger 544 of the valve body closer or farther from a valve seat 542. Movement away from the valve seat allows more flow from the supply plenum to the cooling chamber and movement toward the valve seat reduces the flow. An O-ring 538 prevents coolant from leaking past the valve body out through the bottom plate. A second O-ring (not shown) or other sealing techniques may be used as a preventative measure against leaks.

FIG. 10 also shows an adhesive bond 550 between the cooling plate 512 and the ceramic puck that holds the ceramic puck in place. The ceramic puck includes heater traces 552 as shown 203 in FIG. 2. A clamp electrode 554 is embedded into the ceramic puck 502 to supply an electrostatic force to retain a silicon substrate against the ceramic. These features are among those that are powered by wires that are conducted through the feedthrus mentioned above.

Figure 11:
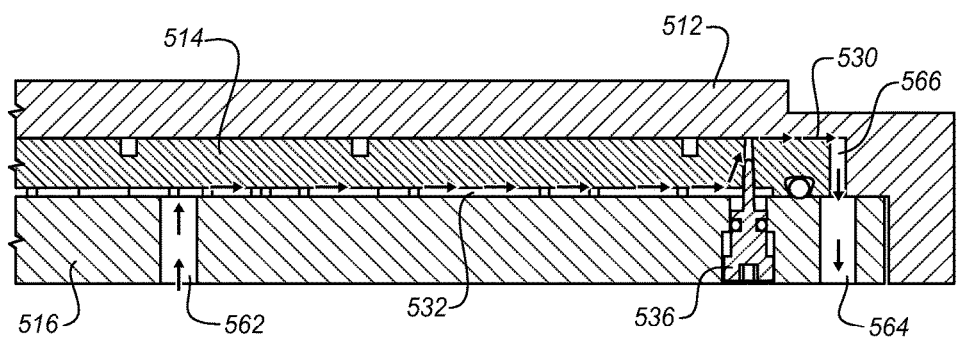
FIG. 11 is a cross-sectional cutaway view of a valve of an electrostatic chuck with arrows to indicate coolant flow in accordance with an embodiment of the invention.

FIG. 11 shows the flow of coolant fluid from inlet to outlet in a cross-sectional diagram of a portion of the cooling plate. Coolant enters the cooling plate through one or more coolant supply ports 562. The supply ports provide the coolant to one or more supply plenums 532 between the bottom plate 516 and the middle plate 514. The supply plenum is open to one side of the valves 536 in the lower plate 516. Coolant flows through open valves 536, through the middle plate 514 into respective cooling chambers 530 between the middle plate 514 and the upper plate 512. From the cooling chambers, the coolant flows to one or more return plenums 566 and then to one or more return ports 564. The return ports conduct the coolant to one or more heat exchangers as shown in FIG. 1 to be cooled and recycled back to the supply ports.

Figure 12:
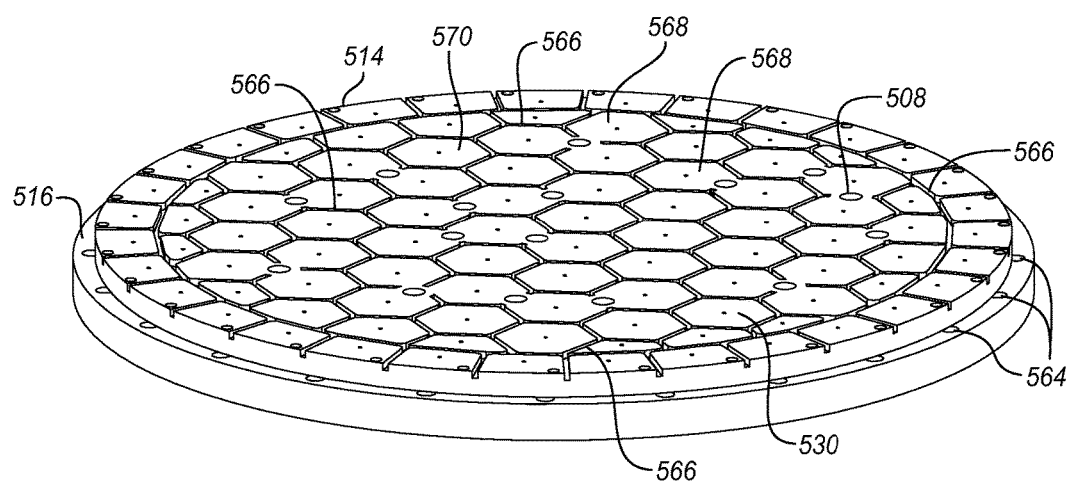
FIG. 12 is a top isometric view of the middle plate of a coolant plate of an electrostatic chuck in accordance with an embodiment of the invention.

FIG. 12 is a top isometric view of the middle plate 514 of the coolant plate showing features that may be cast, stamped, or machined into the middle plate. The middle plate is attached to the bottom plate 516 as shown. The middle plate has hexagonal areas 570 that define the coolant chambers 530 with respect to the top plate (not shown). Each hexagonal area is supplied by the outlet channel 568 from a valve. The coolant fills the space between the hexagonal area 570 and the top plate, cooling the top plate in the hexagonal area. The coolant then flows into return channels 566 that surround each hexagonal area. The return channels lead to a broader circular channel that surrounds all of the hexagonal areas of the middle plate and follows a path near the periphery of the plate. From the circular channel, the coolant flows into radial channels that lead radially outward away from the circular channel and the hexagonal areas to return outlets 564. The return outlets are on the outer edge of the middle plate as shown but may be placed in a different location, depending on the particular implementation.

The hexagonal areas are each supplied by a different valve which may be supplying coolant at a different flow rate from other valves. By feeding the supplied coolant into common channels and a common return plenum as defined by the common channels 566, the fluid pressure through each of the valves may be equalized. The return ports all contribute equally to drawing the coolant away from the cooling plate.

While hexagonal areas are shown, the invention is not so limited. The hexagonal shape provides for a large capacity and length of shared coolant return channels for the amount of cooling area. The coolant chambers may be arranged in rectangular configurations to provide for straight coolant return channels. This may improve flow. An alternating brick style configuration may be used or any of a variety of polygonal and curved coolant areas may be used, depending on the particular implementation.

The overall cooling operation can be summarized as follows. The parts of the cooling plate define a supply plenum that receives coolant through supply ports and distributes the coolant supply across the coolant plate. The supply plenum in this example is defined between the bottom plate and the mid plate. However, the supply plenum may instead be defined by the mid plate and the top plate.

From the supply plenum, coolant flows through flow control valves into cooling zones between the top plate and mid plate. The cooling zones may be in a different location, depending on the particular implementation.

From the cooling zones, flow proceeds into larger spaces between the top plate and the mid plate. These larger spaces form a return plenum. Coolant leaves the ESC from the return plenum through return ports through the mid and bottom plate.

Figure 13:
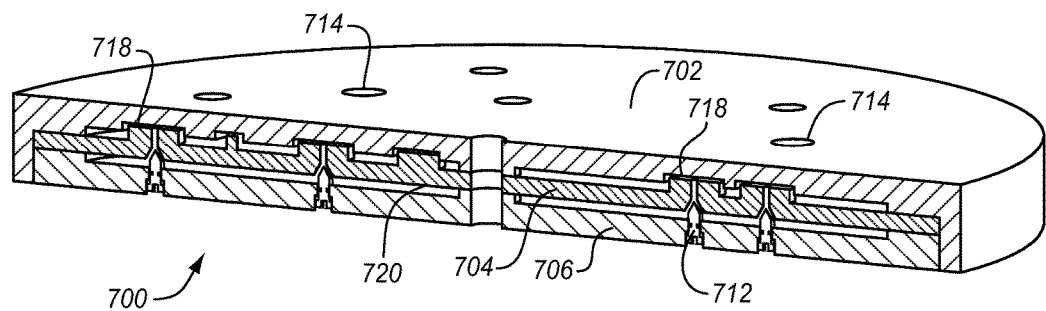
FIG. 13 is a cross-sectional isometric view of an alternative electrostatic chuck in accordance with an embodiment of the invention.

FIG. 13 shows an alternative cooling plate suitable for use with an ESC as described above. The cooling plate 700 is shown with the ceramic puck and other parts removed. This isometric cross-sectional diagram is also simplified and does not show electrical and coolant connections. O-ring grooves and other features are also omitted.

The cooling plate 700 is an assembly of three plates, a top plate 702, a mid plate 704, and a bottom plate 706. As in the example of FIG. 7, the three plates may be joined together with screws, welding, brazing, adhesives or some combination of these approaches and techniques. In this example, a large number of flow control valves 712 are embedded in the bottom cooling plate. Features in the mid plate act as ad-hoc valve seats. The valve plug of each valve is threaded to move up and down through rotation. By moving the valve plug, the flow through each individual cooling zone can be adjusted.

As in the example of FIG. 7, a ceramic puck (not shown) is bonded to the cooling plate 700. Electrical connectors allow the ceramic puck to be energized at clamp electrodes to grip a workpiece. A variety of feedthrus 714 provide other connections to the ceramic puck.

The cooling chambers 718 are defined by these two portions and are between these two portions. In this example, the volumes of the cooling chambers formed are in the top plate, rather than in the mid plate. A supply plenum 720 between the mid plate 704 and the bottom plate 706 supplies coolant at the base of the valve bodies to flow through the valve bodies.

Figure 14A:
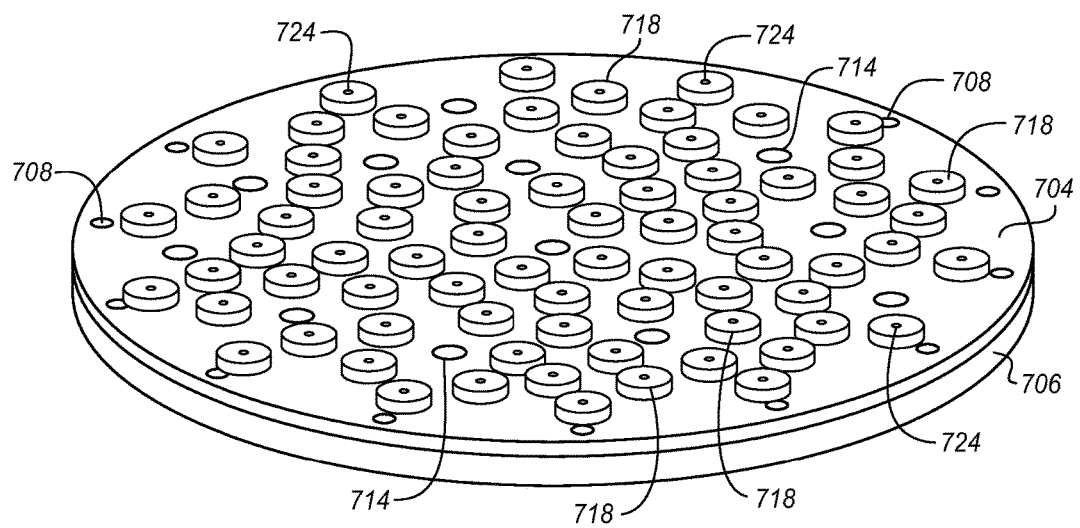
FIG. 14A is a top isometric view of a mid plate over a bottom plate of an electrostatic chuck in accordance with an embodiment of the invention.

FIG. 14A is a top isometric view of the mid plate 704 over the bottom plate 706. The mid plate has feedthrus 714 as mentioned above and a series of general return ports 708 which collect coolant from the individual cooling chambers and feed it back to return lines. The mid plate 704 also has an arrangement of multiple lands that define the cooling chambers with respect to the top plate (not shown). The lands each include an orifice 724 through which coolant is allowed to enter the cooling chamber after passing through a respective valve.

Figure 14B:
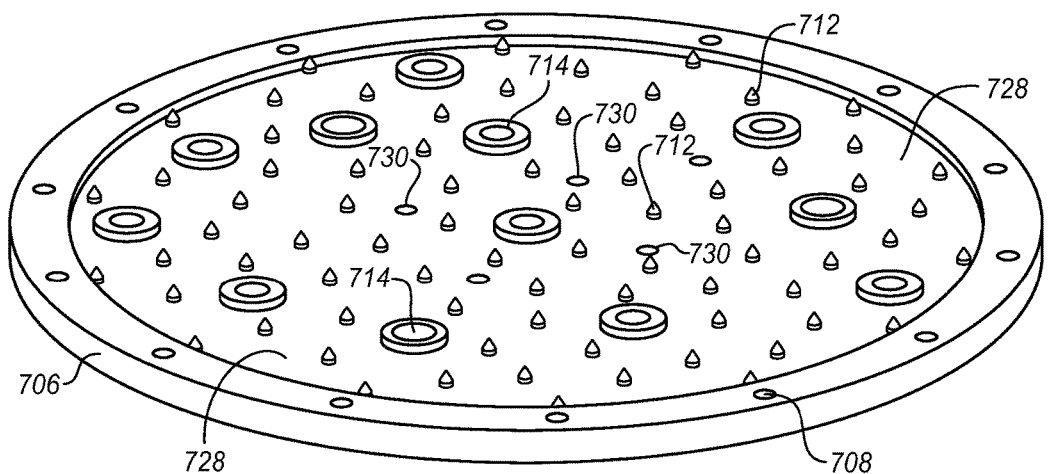
FIG. 14B is a top isometric view of a bottom plate of an electrostatic chuck in accordance with an embodiment of the invention.

FIG. 14B is a top isometric view of the bottom plate 706. The bottom plate includes the feedthrus 714 and the return ports 708 which are also formed in the mid plate. This view also shows the valve bodies 712 installed into the threads (not shown) in the bottom plate and extending up through the bottom plate so that they can move relative to the valve seats in the mid plate to open or close the orifices in the mid plate into the cooling chambers.

The bottom plate is also fitted with one or more supply ports 730. In the illustrated example there are five supply ports, however there may be fewer or many more, depending on the particular implementation. The supply ports provide coolant into the area between the top surface 728 of the bottom plate and the bottom surface of the mid plate. This area serves as the supply plenum 720 for the orifices 724 in the top plate. Coolant provided into the supply ports will be contained in part by the top surface 728 of the bottom plate 706. Pressure from the supply ports will then drive the coolant into the orifices 724 of the top plate past the valve bodies 712 of the bottom plate which fit into the valve seats of the orifices.

Figure 15A:
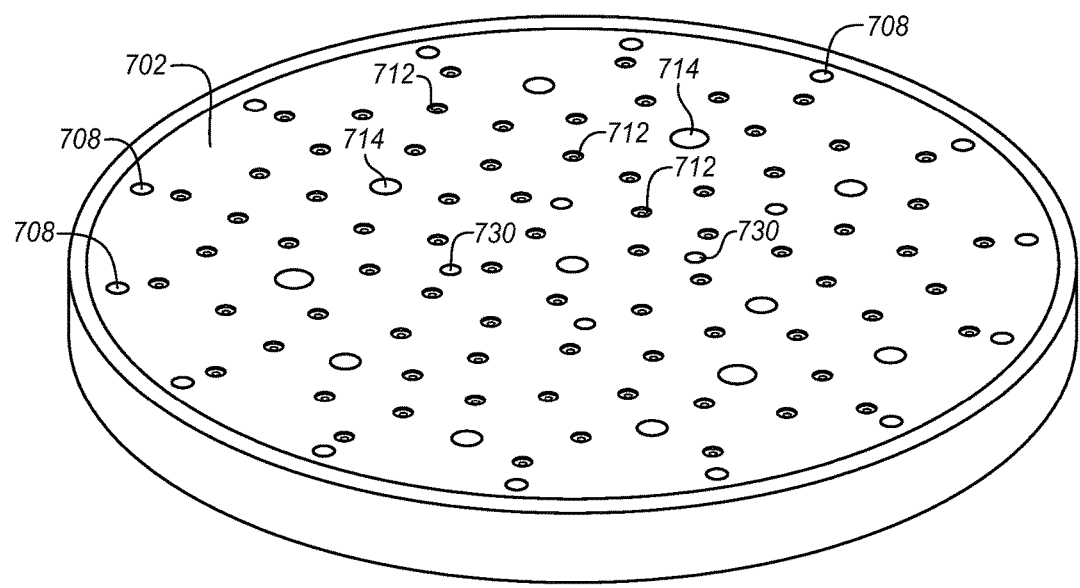
FIG. 15A is a bottom isometric view of a bottom plate of an electrostatic chuck in accordance with an embodiment of the invention.

FIG. 15A is a bottom isometric view of the bottom plate 706 of FIG. 14B. The bottom side of the bottom plate includes feedthrus 714 and return ports 708. The supply ports 730 allow coolant to be supplied through the bottom plate toward the opposite side of the bottom plate into the supply plenum. The supply ports have attachment points to allow a coolant supply and heat exchanger system to be coupled to the supply ports. The bottom plate also has holes 708 for the return ports to supply coolant back to the heat exchanger system after it has passed through the coolant chambers to cool the cooling plate and the chuck's top surface.

The bottom plate also provides access to the valve bodies 712. Each valve body may be accessed and rotated from the bottom surface of the bottom plate to adjust its position against its respective valve seat. In assembly, the three portions 702, 704, 706 of the cooling plate 700 are attached together and then the valve bodies 712 are screwed into threads of the bottom plate. This may be done by hand or using an automated tool. As described in more detail below an adjustment fixture may then be attached to the bottom of the bottom plate that includes motors to rotate the valves as the ESC is calibrated against manufacturing variations, a chamber, a process or any other circumstances.

Figure 15B:
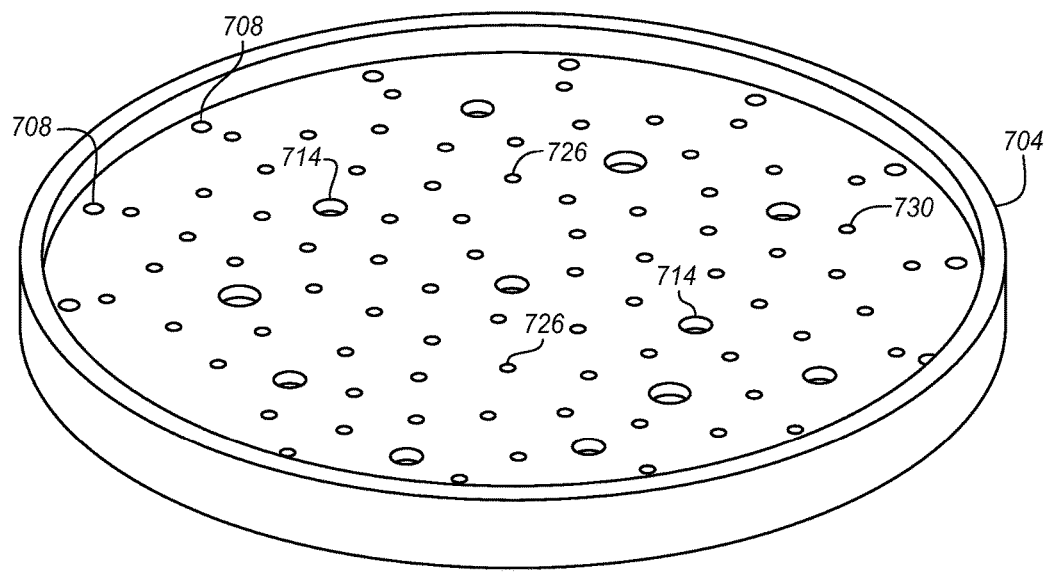
FIG. 15B is a bottom isometric view of a cooling plate with the bottom plate of an electrostatic chuck removed in accordance with an embodiment of the invention.

FIG. 15B is a bottom isometric view of the cooling plate 700 with the bottom plate removed. From the bottom side, the valve seats 726 are visible as are the feedthrus 714 and return ports 708. The bottom surface of the mid plate 704 forms an upper surface of the supply plenum 720 so that coolant supplied into the area below the bottom of the mid plate will be captured between the bottom surface of the mid plate and a top surface 728 of the bottom plate. The coolant may flow freely from the supply plenum into the orifices that include the valve seats 726. The coolant that flows past the valve seats will enter into the respective coolant chamber for each valve.

Figure 15C:
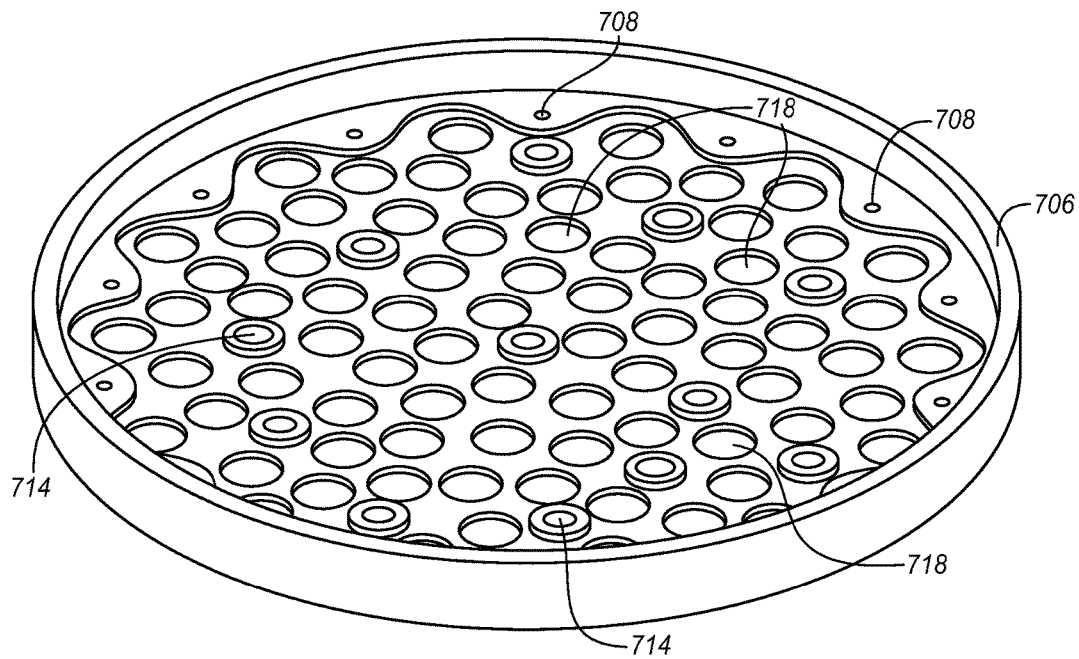
FIG. 15C is a bottom isometric view of a top plate of an electrostatic chuck in accordance with an embodiment of the invention.

FIG. 15C is a bottom isometric view of the top plate 706. In addition to feedthrus 714 and return ports 708, an outline for each coolant chamber 718 is shown. The individual chambers are aligned over each respective valve seat and orifice 724 so that coolant fluid that passes through each valve is delivered into a respective coolant chamber.

The cooling zones are shown as circular and uniformly sized. The shape, size, and positions of the cooling zones may be modified to suit any particular local cooling requirements. In addition, the height of the channel in the cooling zone (between the top and mid plate) may be modified to achieve a uniform, or a non-uniform, heat transfer across the zone.

Figure 16:
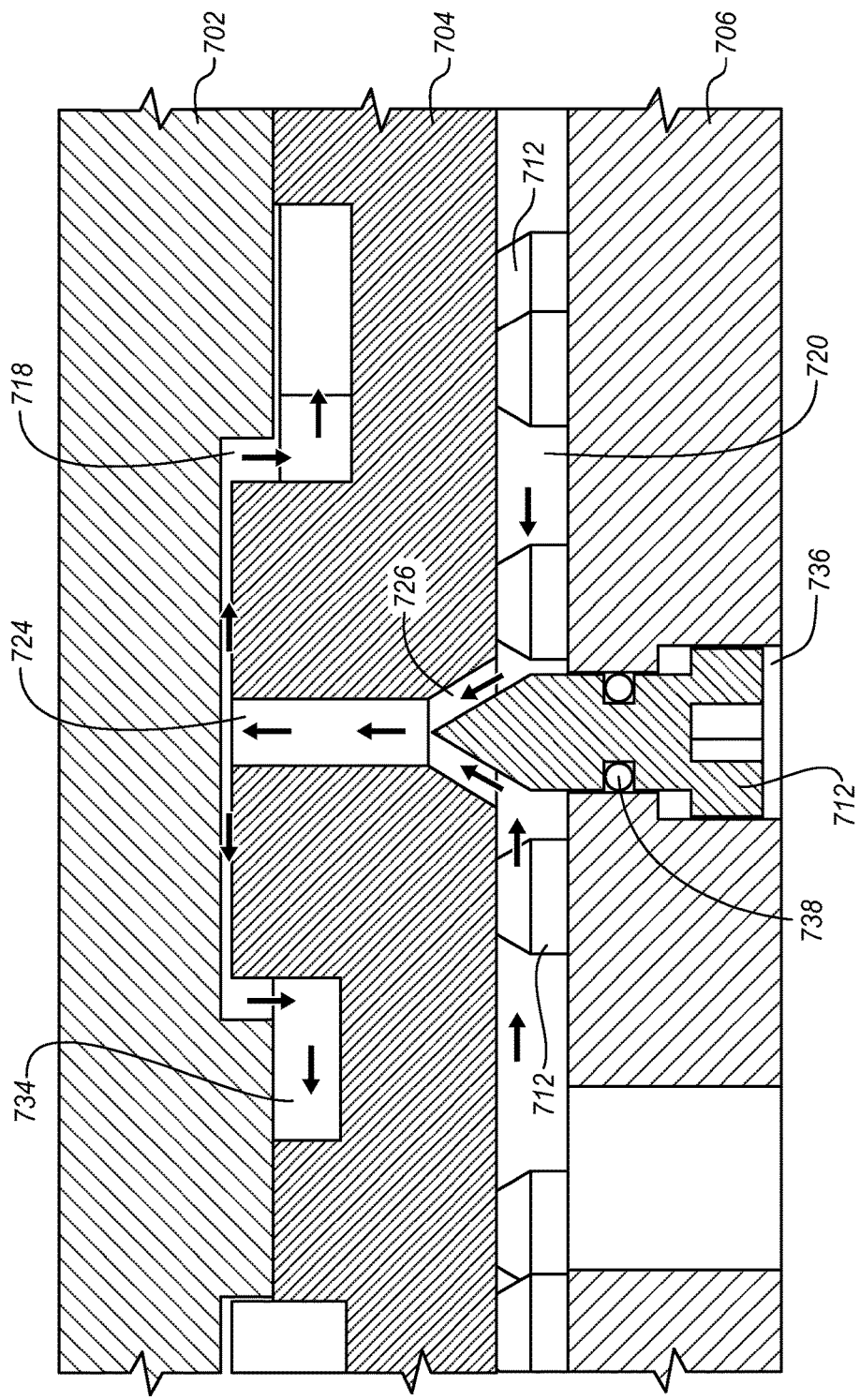
FIG. 16 is a cross-sectional side view of a cooling plate of an electrostatic chuck in accordance with an embodiment of the invention.

FIG. 16 is a cross-sectional side view of the cooling plate with all three of the plates 702, 704, 706 installed together. A valve body 712 is attached to the bottom plate 706 with threads 736 that allow the valve body to move up and down towards and away from the valve seat 726 as the valve body is turned. Coolant in the supply plenum 720 between the bottom 706 and mid 704 plates flows past the valve seat 726 through the orifice 724 into a cooling chamber 718 above the valve. The coolant will absorb heat from the top plate 702 in the cooling chamber and then move to the return plenum 734. The cooling chamber and the return plenum are defined within a space between the top 702 and mid 704 plates and defined by the shape and the configuration of the two plates with respect to each other. From the return plenum, the coolant flows through return ports to heat exchangers to be cooled and then returned back to the supply plenum 720 through supply ports.

Figure 17:
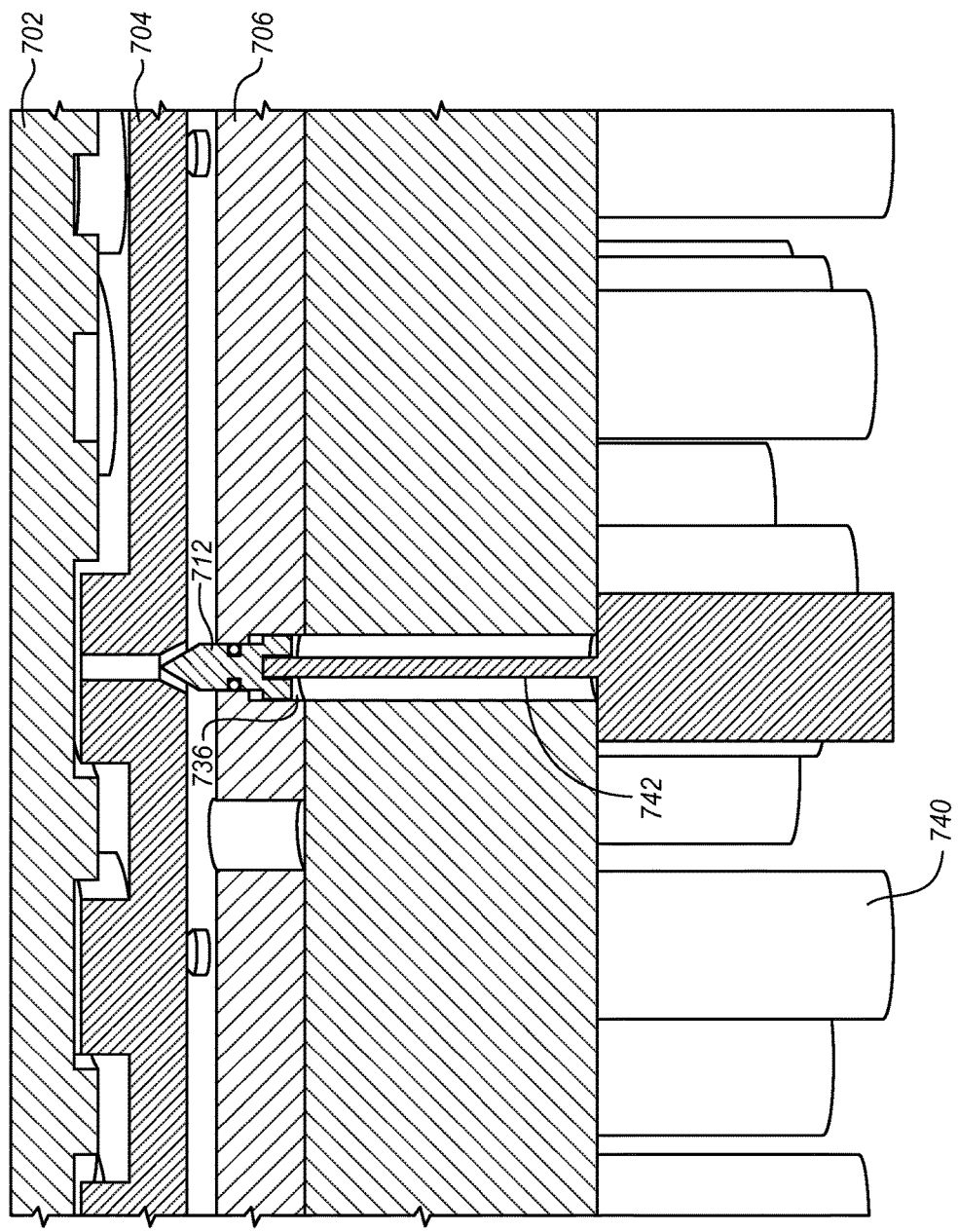
FIG. 17 is a cross-sectional side view of a cooling plate of an electrostatic chuck with gear motors attached to valve bodies of the cooling plate in accordance with an embodiment of the invention.

FIG. 17 shows a similar cross-sectional view of the cooling plate with gear motors 740 attached to each valve body 712 through a drive shaft 742. As the gear motor drives the shaft, the valve body rotates against the threads to modify the flow rate of coolant through the orifice. Using a separate gear motor for each valve body allows the valves to be adjusted individually. Alternatively, a drive system may be used to allow a single motor to operate each of the valve bodies independently. As another alternative, a single gear motor may be moved from one valve to another until each of the valves has been adjusted to a desired position.

Figure 18:
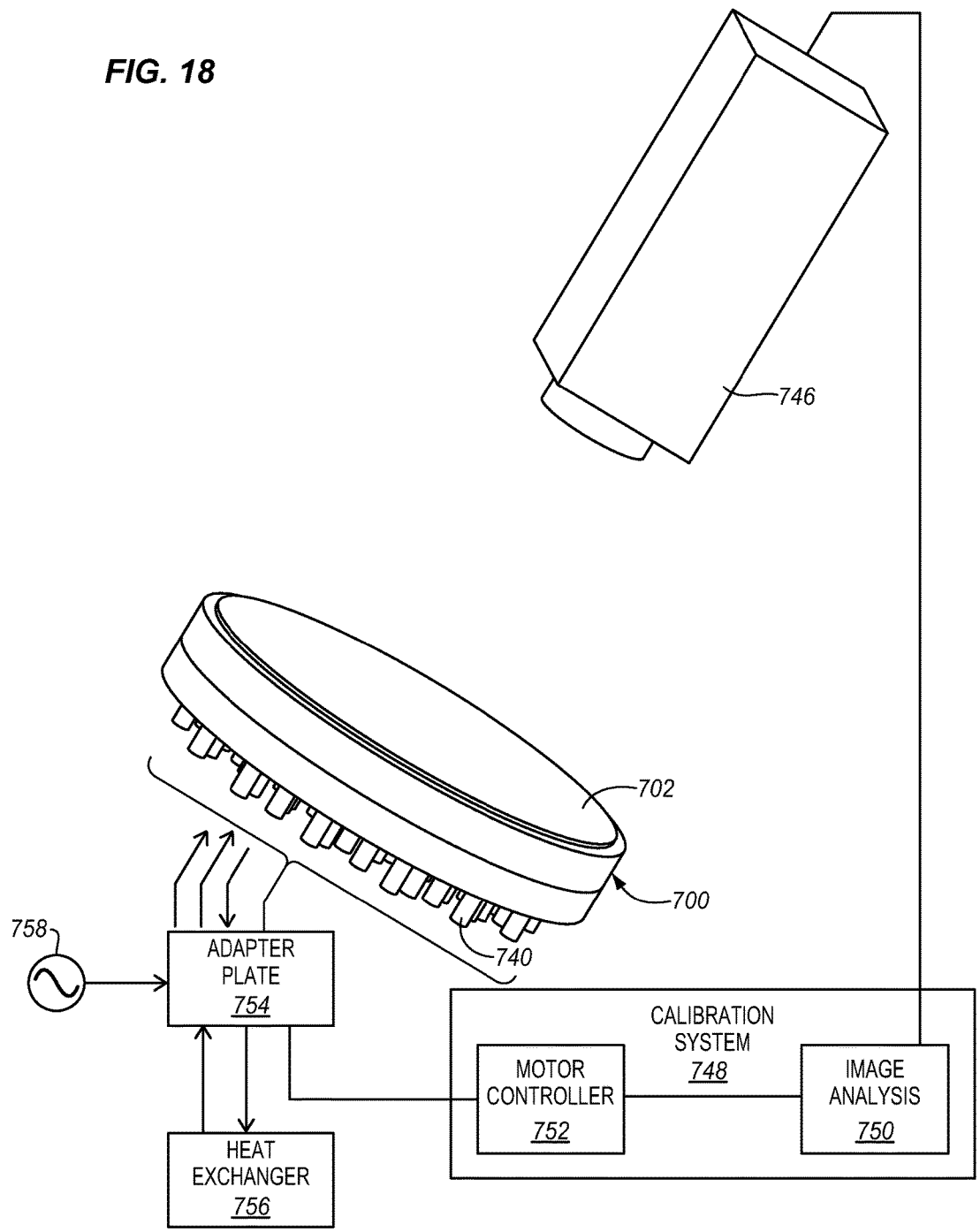
FIG. 18 is a diagram of calibrating the valve positions for a cooling plate of an electrostatic chuck in accordance with an embodiment of the invention.

FIG. 18 is a diagram of calibrating the valve positions for a cooling plate 700. In the illustrated example, a ceramic puck 748 is attached to a cooling plate 700. The gear motors 740 of an adjustment fixture are attached to each of the valve bodies, as shown, for example, in FIG. 17. The ceramic plate is heated externally or using it own heaters and the heat exchangers (not shown) are attached to the supply and return ports of the ESC. As the ESC is heated and cooled, the temperature of the ceramic plate is measured using, for example, an infrared camera 746 or a temperature monitor wafer.

The camera is coupled to a calibration system 748 that operates the gear motors. The calibration system may be a computer or a dedicated system designed for this purpose. The infrared image from the camera is analyzed in an image analysis module 750 and compared to a reference or intended infrared image. Differences between the measured temperature at each point on the ceramic plate and the desired temperature for that point are then used to determine valve adjustments for the various cooling zones across the ceramic plate. The valve adjustments are provided to a motor controller 752 of the calibration system. The motor controller then drives the gear motors to adjust the valves. Any resulting temperature differences are observed by the IR camera or a temperature monitor wafer. Further adjustments may then be made until the desired coolant flow is obtained.

The flow to each cooling zone may be adjusted by the respective gear motor after the ESC is manufactured. The valve plug positions may be set during a one-time calibration process. This calibration process may be used to compensate for manufacturing non-uniformities.

Figure 19:
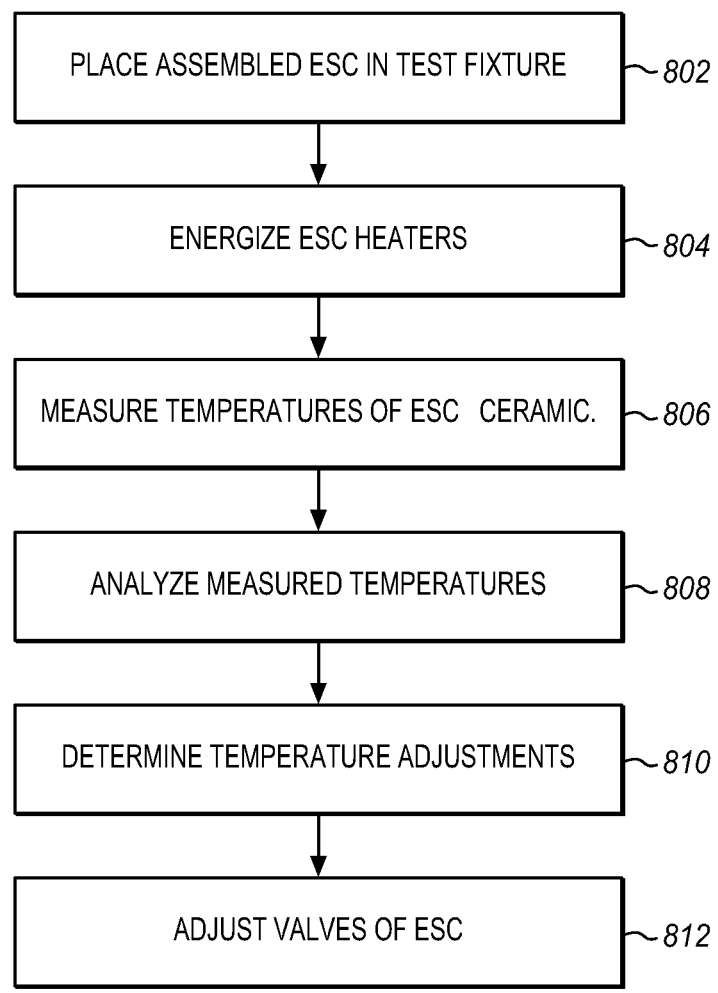
FIG. 19 is a process flow diagram of adjusting a valve in an electrostatic chuck in accordance with an embodiment of the invention.

The calibration process may be described as shown in FIG. 19. First at 802, the assembled ESC is placed in a test fixture. The test fixture has the IR camera 746 and an adapter plate 754 which makes coolant 756 and electrical 758 connections to the ESC. The adapter plate also contains small gear-motors 740 which turn the valve plugs to adjust coolant flow to each cooling zone.

At 804, heat is applied to the ESC. This may be done in a process chamber or oven, or by activating or energizing heater traces within the ESC. At 806, the temperature of the top plate of the ESC measured. In the system of FIG. 18, the dielectric puck is imaged by an infrared camera, but the invention is not so limited.

At 808, a computer-based control algorithm may be used to analyze the temperatures of the ESC and at 810 to determine adjustments. At 812, the position of each valve plug may be adjusted serially or simultaneously by driving the gear motors. The IR camera 746 may be used to provide real-time feedback as the valves are adjusted. This adjustment process may continue until the desired temperature profile (uniform or otherwise) is achieved.

The individual adjustment of each valve may be used to achieve extremely uniform wafer temperature during a fabrication process. Changes in coolant flow may be used to compensate for variations in the thickness of the bond between the ceramic puck and the cooling plate and for variations in the printing of heater traces within the ceramic puck. In addition the ESC may be calibrated to a deliberately non-uniform temperature profile. This may be used to compensate for chamber level asymmetries.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method for adjusting coolant flow in an electrostatic chuck, the method comprising:
heating a dielectric puck, the dielectric puck being for electrostatically gripping a silicon wafer;
detecting heat at a plurality of locations on a top surface of the dielectric puck, the locations each being thermally coupled to at least one of a plurality of coolant chambers of the electrostatic chuck; and
adjusting a plurality of valves to control coolant flow into the coolant chambers based on the detected heat, wherein the plurality of valves is embedded within the electrostatic chuck.

2. The method of claim 1, wherein detecting heat comprises imaging the dielectric puck during flowing coolant into the coolant chambers through the valves and during applying heat to the dielectric puck.

3. The method of claim 2, wherein applying heat comprises activating heaters within the electrostatic chuck.

4. The method of claim 1 wherein adjusting a plurality of valves comprises independently rotating valve bodies of each of the plurality of valves to move the valve bodies with respect to a valve seat to control the flow of coolant from a supply plenum to a respective coolant chamber.

5. The method of claim 1, wherein detecting heat comprises determining a temperature level at different areas of the dielectric puck, the different areas corresponding to different coolant chambers.

6. The method of claim 5, wherein adjusting the plurality of valves comprises increasing coolant flow to coolant chambers corresponding to hotter areas and decreasing coolant flow to coolant chambers corresponding to cooler areas.

7. The method of claim 1, wherein adjusting valves comprises driving gear motors of a valve controller, the gear motors each being coupled to a respective one of the valves to individually control coolant flow into each respective coolant chamber.

8. The method of claim 1, wherein adjusting a plurality of valves comprises adjusting valves between a common supply plenum that receives coolant from an external source and each of the plurality of coolant chambers to control the flow rate of coolant from the supply plenum to the respective cooling zone.

9. The method of claim 1, wherein the coolant chambers are within a cooling plate fastened to and thermally coupled to the dielectric puck.

10. The method of claim 1, wherein adjusting a plurality of valves comprises activating a valve controller to engage and independently control each valve to adjust the flow of coolant through each valve by driving a gear motor to adjust the position of a valve body of each respective valve.

11. The method of claim 9, wherein controlling flow into the coolant chambers comprises controlling flow through a respective plurality of orifices each defined in a middle plate of the cooling plate into respective coolant chambers of the middle plate.

12. The method of claim 11, wherein the middle plate has hexagonal areas to define the coolant chambers.

13. The method of claim 12, wherein each hexagonal area is supplied by a different one of the plurality of valves.

14. An apparatus for adjusting coolant flow in an electrostatic chuck, the apparatus comprising:
means for heating a dielectric puck, the dielectric puck being for electrostatically gripping a silicon wafer;
means for detecting heat at a plurality of locations on a top surface of the dielectric puck, the locations each being thermally coupled to at least one of a plurality of coolant chambers of the electrostatic chuck; and
means for adjusting a plurality of valves to control coolant flow into the coolant chambers based on the detected heat, wherein the plurality of valves is embedded within the electrostatic chuck.

15. The apparatus of claim 14, wherein the means for detecting heat comprises an imager to image the dielectric puck during flowing coolant into the coolant chambers through the valves and during applying heat to the dielectric puck.

16. The apparatus of claim 15, wherein the means for heating comprises resistance heaters activated within the electrostatic chuck.

17. The apparatus of claim 14 wherein the means for adjusting a plurality of valves comprises independently rotatable valve bodies of each of the plurality of valves to move the valve bodies with respect to a valve seat to control the flow of coolant from a supply plenum to a respective coolant chamber.

18. The apparatus of claim 14, wherein the means for adjusting comprises a processor coupled to the means for detecting heat and to a valve controller to operate a motor of the valve controller to adjust coolant flow based on the detected heat.

19. The method of claim 14, wherein the means for detecting heat determines a temperature level at different areas of the dielectric puck, the different areas corresponding to different coolant chambers.

20. The method of claim 19, wherein the means for adjusting the plurality of valves operates by increasing coolant flow to coolant chambers corresponding to hotter areas and decreasing coolant flow to coolant chambers corresponding to cooler areas.

\* \* \* \* \*